United States Patent [19]
Duane

[11] Patent Number: 5,686,346
[45] Date of Patent: Nov. 11, 1997

[54] METHOD FOR ENHANCING FIELD OXIDE THICKNESS AT FIELD OXIDE PERIMETERS

[75] Inventor: Michael P. Duane, Austin, Tex.

[73] Assignee: Advanced Micro Devices, Inc., Sunnyvale, Calif.

[21] Appl. No.: 622,696

[22] Filed: Mar. 26, 1996

[51] Int. Cl.[6] .................................................. H01L 21/76
[52] U.S. Cl. ........................................... 437/69; 437/70
[58] Field of Search ............................ 437/69, 72, 62, 437/70, 238

[56] References Cited

U.S. PATENT DOCUMENTS

| | | | |
|---|---|---|---|
| 4,722,910 | 2/1988 | Yasaitis | 437/238 |
| 4,952,525 | 8/1990 | Van Der Plas | 437/72 |
| 5,273,936 | 12/1993 | Ikeda | 437/238 |

FOREIGN PATENT DOCUMENTS

| | | | |
|---|---|---|---|
| 582515 | 4/1993 | Japan | 437/69 |
| 5259450 | 10/1993 | Japan | 437/69 |

OTHER PUBLICATIONS

S. Wolf, "Silicon Processing for the VLSI Era", *Lattice Press*, California, vol. 2, pp. 17–44.

*Primary Examiner*—Charles L. Bowers, Jr.
*Assistant Examiner*—Matthew Whipple
*Attorney, Agent, or Firm*—Kevin L. Daffer; Conley, Rose & Tayon

[57] ABSTRACT

A method for enhancing the thickness of a field oxide layer at perimeters of the field regions is presented. The use of a relatively thin pad oxide layer under a nitride layer reduces lateral encroachment of the field oxide layer into device active areas, but also results in undesirable elevational disparities in an upper surface of the field oxide layer near perimeters. Elevational disparities are created when the field oxide layer grows up and around vertical edges of remaining portions of the patterned nitride layer. An oxide deposition step followed by a directional etch process are used to fill in the elevational disparities, increasing the thickness of the field oxide layer at perimeters of the field regions. In a first embodiment, an oxide layer is deposited over the exposed surface following removal of remaining portions of the nitride layer over device active areas. In a second and third embodiment, oxide layer deposition and etch follow removal of substantially all of the remaining portions of the pad oxide layer and an upper portion of the field oxide layer as to expose the silicon substrate in device active areas. In the third embodiment, a sacrificial oxide layer is grown in and on device active areas prior to oxide layer deposition and etch.

12 Claims, 10 Drawing Sheets

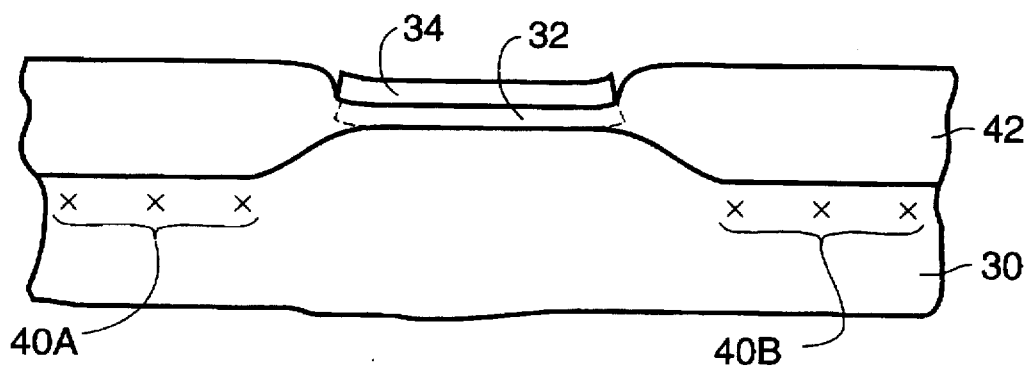
FIG. 2h
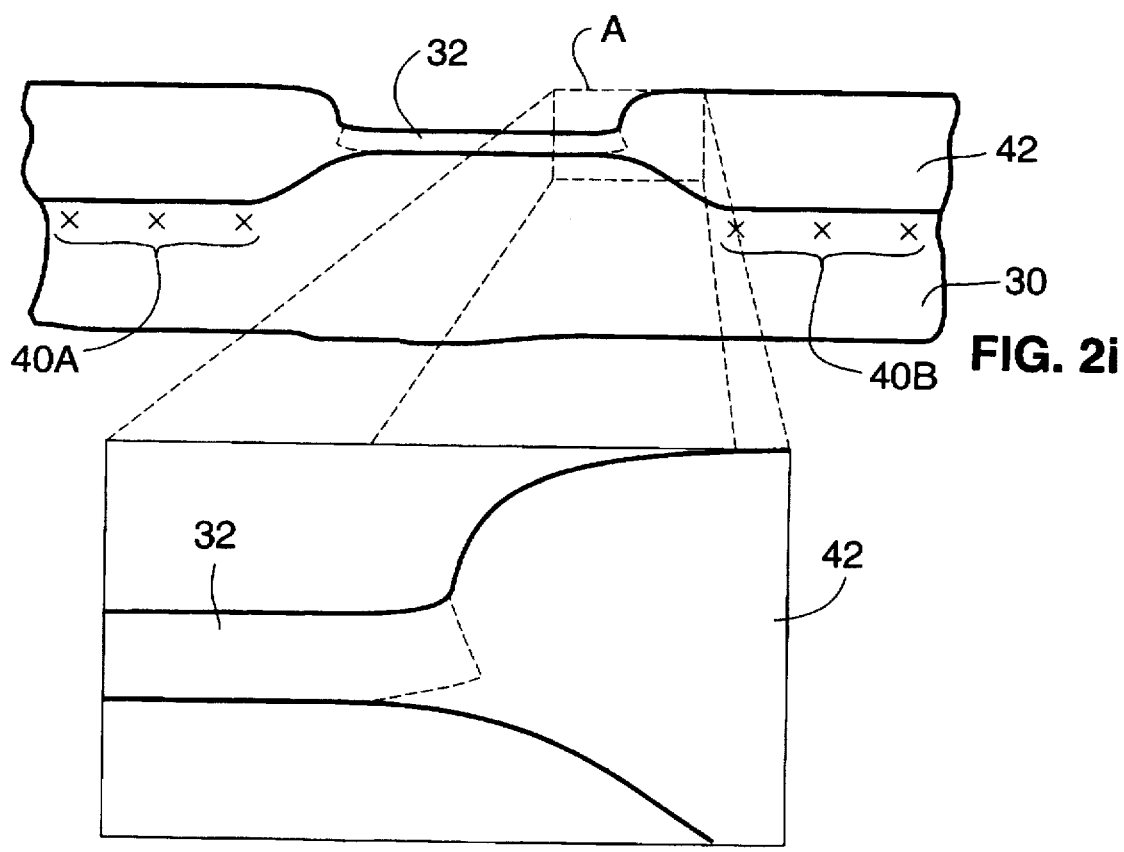
FIG. 2i
FIG. 2j

METHOD FOR ENHANCING FIELD OXIDE THICKNESS AT FIELD OXIDE PERIMETERS

BACKGROUND OF THE INVENTION

1. Field of the Invention

This invention relates to integrated circuit fabrication and more particularly to an MOS integrated circuit having an enhanced local oxidation of silicon (LOCOS) structure.

2. Description of the Relevant Art

Metal oxide semiconductor (MOS) transistors (i.e., devices) are typically formed in isolated active device regions of a frontside surface of a semiconductor substrate. These active device regions are separated by field regions. Electrically insulating layers of silicon dioxide (i.e., oxide) are usually formed over the field regions (i.e., field oxide), and the MOS transistors are electrically coupled by conductive trace elements called interconnects. An interconnect which overlies field oxide between device active areas may inappropriately function as a gate electrode of a parasitic MOS transistor formed between diffused regions of two adjacent MOS devices. Certain measures must be taken to ensure that any possible operating voltage present between the interconnect and the underlying silicon substrate is not sufficient to invert the substrate surface beneath the interconnect. If the substrate beneath field oxide is allowed to invert, a conductive channel will form between the diffused regions of the parasitic MOS transistor. Current flow through parasitic MOS transistors will either cause more power to be dissipated than expected or, in the extreme, cause the circuit to malfunction.

To avoid parasitic conditions, it becomes necessary to raise the turn-on threshold of any parasitic MOS transistors formed in the field regions. One way to raise the turn-on threshold of parasitic MOS transistors is to increase the thickness of the field oxide. Alternatively, or in addition to increasing field oxide thickness, field region doping levels can be increased.

Local oxidation of silicon (LOCOS) is a standard method of forming a thick insulating layer of silicon dioxide (i.e., field oxide) over field regions of a silicon substrate. In a typical LOCOS process, a silicon nitride (nitride) layer is deposited over a relatively thin pad oxide layer. In the field regions, these layers are removed leaving oxide masking structures over the device active areas. FIG. 1a is a partial cross-sectional view of a silicon substrate 10 with an oxide masking structure over a device active area on a frontside surface of silicon substrate 10. A nitride layer 14 functions as the oxide masking structure for a subsequent oxidation step as oxygen and water vapor diffuse very slowly through nitride layer 14. A pad oxide layer 12 cushions the transition of stresses between nitride layer 14 and silicon substrate 10. A relatively thick field oxide layer is then selectively grown over the exposed field regions using an oxidation process. See, S. Wolf, *Silicon Processing for the VLSI Era*, Vol. 2, pp. 17–44 (herein incorporated by reference).

FIG. 1b is a partial cross-sectional view of silicon substrate 10 following thermal growth of a field oxide layer 16. Pad oxide layer 12 merges into field oxide 16 at the periphery of nitride layer 14. Field oxide 16 encroaches into the device active area under nitride layer 14 and pad oxide layer 12 in regions 18a and 18b, forming well-known "bird's beak" extensions. Following growth of field oxide layer 16, nitride layer 14 is removed. Substantially all of pad oxide layer 12 and an upper portion of field oxide layer 16 are then removed to expose the upper surface of silicon substrate 10 in device active area 20. As defined herein, a device active area is one having gate regions of polysilicon with underlying channel areas separating source/drain plants. Substantially removed pad oxide layer 12 over active area 20 allows one or more MOS devices to be subsequently formed in and on the frontside surface of silicon substrate 10.

Unfortunately, any thinning of field oxide 16 at the perimeter of the field regions (e.g., in regions 18a and 18b) may reduce the electrical isolation between an interconnect subsequently formed over region 18a or 18b and the underlying substrate. Normal operating voltages driven onto such an interconnect may deleteriously activate an associated parasitic MOS transistor. In addition, reduced electrical isolation between the interconnect and the underlying substrate results in an increase in capacitance between the interconnect and the underlying silicon substrate. This increased capacitance results in an increased signal delay time associated with the interconnect increased signal delay time in a critical circuit path may reduce the maximum operating speed of the integrated circuit. Thus regions 18a and 18b represent high capacitance areas which pose operational problems in an ensuing integrated circuit structures. Further, thinned regions 18a and 18b causes a rapid change in elevation (i.e., a "step") to occur at the perimeter of the field. Such steps pose step coverage problems in subsequently deposited interconnects.

It is possible to increase the number of devices which may be formed in and on a frontside surface of a semiconductor substrate (i.e., increase the device density) by reducing the lateral dimensions of regions 18a and 18b. A steeper slope at the upper surface of field oxide 16 abutting with active area 20 would allow for laterally smaller regions 18a and 18b. Increase in slope can be brought about by increasing the thickness of field oxide 16 in regions 18a and 18b. It would thus be advantageous to have a method for enhancing the thickness of field oxide at perimeters of the field regions. Such enhancements to field oxide 16 thickness must be achieved without causing encroachment of field oxide into active area 20, however.

SUMMARY OF THE INVENTION

The problems outlined above are in large part solved by a method for enhancing the thickness of a field oxide layer at perimeters of the field regions. The use of a relatively thin pad oxide layer under a nitride layer reduces lateral encroachment of the field oxide layer into device active areas, but also results in undesirable elevational disparities in an upper surface of the field oxide layer near perimeters. An oxide deposition step followed by a directional etch process are used to fill in the elevational disparities, increasing the thickness of the field oxide layer at perimeters of the field regions. The thickness of the field oxide layer remains sufficient to provide electrical isolation even after subsequent wet etches.

The present method utilizes localized thickening of the field oxide at the field/active area interface without causing lateral encroachment of the field oxide into the active area. The method includes growing a relatively thin pad oxide layer over a frontside surface of a silicon wafer. The pad oxide layer is thick enough to cushion the transition of stresses between the silicon wafer and a subsequently formed nitride layer, yet thin enough to help reduce lateral encroachment of a subsequently grown field oxide into the active areas. A nitride layer is deposited over the pad oxide layer. The pad oxide and nitride layers are selectively patterned to remove portions over the field regions. The remaining portions of the nitride layer form oxide barrier structures over device active areas. Channel stop implants may be directed into exposed field regions. A field oxide layer is then thermally grown over the field regions. The remaining portions of the nitride layer are then removed.

The use of a relatively thin pad oxide layer minimizes lateral growth of field oxide into the pad oxide cross-section at the field oxide perimeter. A lessened lateral growth provides a relatively abrupt elevational disparity in the upper surface of the field oxide perimeter. It is believed that while thin pad oxide helps minimize lateral growth of field oxide into the active area, thin pad oxide causes a relatively abrupt elevational disparity at the field/active area interface. It appears the field oxide grows almost in a vertical orientation (i.e., normal to the substrate surface) at the edges of the patterned nitride layer. The abruptness of the field oxide at the edges of the patterned nitride layer have been found to be dependent upon the thickness of the nitride layer and the oxidation conditions. In accordance with the present embodiments, the elevational disparity is substantially eliminated or minimized by filling in (or smoothing) the stepped juncture by locally thickening the stepped area. Localized thickening is achieved by depositing a planarizing dielectric material across the entire exposed surface and thereafter directionally removing portions of the deposited dielectric. Those portions of the planarizing dielectric material remaining after the removal step reside primarily adjacent the vertical wall created at the field oxide edge.

The method for enhancing the thickness of the field oxide layer at perimeters includes several embodiments. In a first embodiment, an oxide layer is deposited over the field oxide layer and the remaining portions of the pad oxide layer following removal of the remaining portions of the nitride layer. A directional etch process is then used to remove most of the oxide layer and a portion of an upper surface of the field oxide layer. In a second and third embodiment, substantially all of the remaining portions of the pad oxide layer and an upper portion of the field oxide layer are removed in order to expose the silicon substrate in device active areas. In the second embodiment, an oxide layer is then deposited over the field oxide layer and the device active areas. A directional etch process is then used to remove most of the oxide layer, and is continued until all oxide is removed from over the device active areas. The third embodiment involves growing a sacrificial oxide layer in and on regions of exposed silicon in device active areas following removal of substantially all of the remaining portions of the pad oxide layer and an upper portion of the field oxide layer. An oxide layer is then deposited over the field and sacrificial oxide layers. A directional etch process is used to remove most of the oxide layer and virtually all of sacrificial oxide layer.

BRIEF DESCRIPTION OF THE DRAWINGS

Other objects and advantages of the invention will become apparent upon reading the following detailed description and upon reference to the accompanying drawings in which:

FIG. 2h is a partial cross-sectional view of the silicon substrate following formation of field oxide over field regions;

FIG. 2i is a partial cross-sectional view of the silicon substrate following removal of the remaining portions of the nitride layer;

FIG. 2j is a detailed view along plane A of FIG. 2i showing an undesirable elevational disparity in an upper surface of the field oxide layer near a perimeter of the field oxide layer;

FIG. 7b is a continuation of the flow chart of FIG. 7a.

Figure 1A:
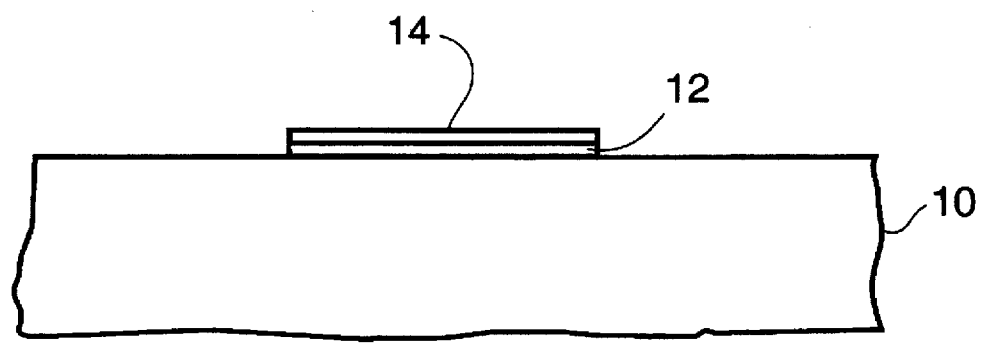
FIG. 1a is a partial cross-sectional view of a silicon substrate with a LOCOS oxide masking structure over a device active area on a frontside surface of the silicon substrate.
Figure 1B:
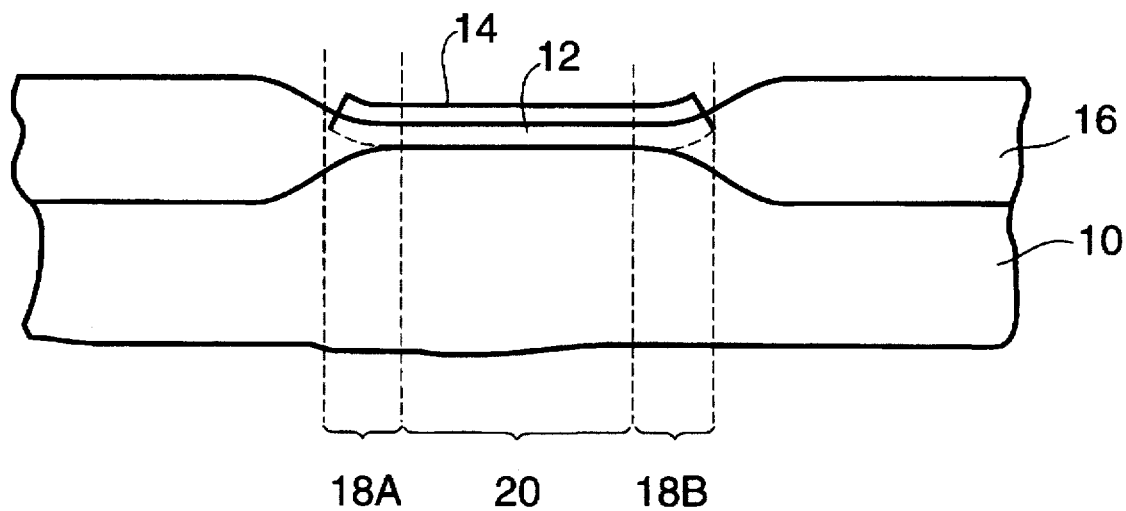
FIG. 1b is a partial cross-sectional view of the silicon substrate of FIG. 1a following thermal growth of a field oxide layer over field regions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2A:
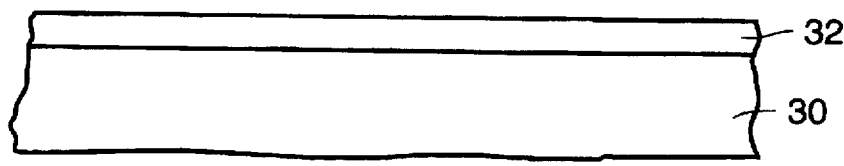
FIG. 2a is a partial cross-sectional view of a silicon substrate with a pad oxide layer formed upon a frontside surface.

FIGS. 2a–6d illustrate processing steps of various embodiments of the present invention. FIG. 2a is a partial cross-sectional view of a silicon substrate 30 with a pad oxide layer 32 formed upon a frontside surface of silicon substrate 30. Pad oxide layer 32 cushions the transition of stresses between silicon substrate 30 and a subsequently deposited nitride layer. Pad oxide layer 32 may be thermally grown according to common wet or dry oxidation processes. A suitable wet oxidation process involves placing silicon substrate 30 into an oxidation furnace containing water vapor ($H_2O$), and increasing the temperature within the oxidation furnace to between 800° C. and 1200° C. An oxide ($SiO_2$) layer may thus be formed through the following reaction:

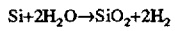

The lateral encroachment distance of a subsequently formed field oxide layer into device active areas is directly proportional to the thickness of pad oxide layer 32. Pad oxide layer 32 must be thick enough to cushion the transition of stresses between silicon substrate 30 and a subsequently formed nitride layer, yet thin enough to reduce the lateral encroachment of a subsequently formed field oxide layer. Pad oxide layer 32 is preferably grown to a thickness of between 100 angstroms and 400 angstroms.

Figure 2B:
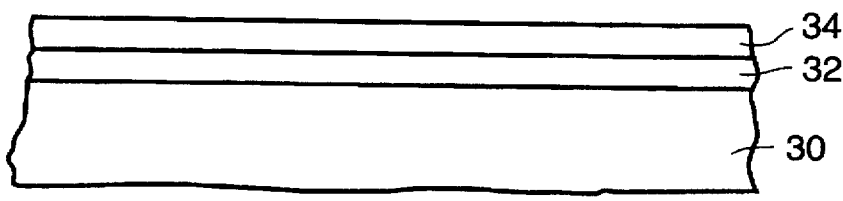
FIG. 2b is a partial cross-sectional view of the silicon substrate of FIG. 2a with a nitride layer deposited upon the pad oxide layer.

A nitride layer is then deposited over the pad oxide layer. FIG. 2b is a partial cross-sectional view of silicon substrate 30 with a nitride layer 34 deposited upon pad oxide layer 32. Nitride layer 34 functions as an oxide mask (i.e., an oxide barrier) for a subsequent oxidation step as oxygen and water vapor diffuse very slowly through nitride layer 34. Nitride layer 34 is preferably deposited using well-known chemical vapor deposition (CVD) techniques. One such method involves placing silicon substrate 30 in a reaction chamber containing dichlorosilane ($SiCl_2H_2$) and ammonia ($NH_3$), increasing the temperature inside the reaction chamber to between 350° C.–450° C., and reducing the pressure inside the reaction chamber. A layer of nitride ($Si_3N_4$) may thus formed according to the following reaction:

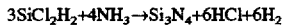

The maximum thickness of nitride layer 34 is determined by the stress-relieving capability of pad oxide layer 32. If nitride layer 34 is too thick, a significant amount of stress will be created and transferred through pad oxide layer 32 to the underlying surface of silicon substrate 30. This stress may create defects on and just under the surface of silicon substrate 30. Such defects may degrade operational characteristics of MOS devices subsequently formed in and on the surface of silicon substrate 30. Nitride layer 34 is preferably deposited to a thickness of between 1,000 angstroms and 2,000 angstroms.

Figure 2C:
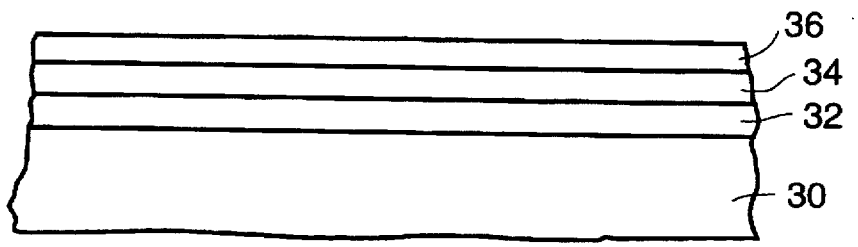
FIG. 2c is a partial cross-sectional view of the silicon substrate with a photoresist layer formed over the nitride layer.
Figure 2D:
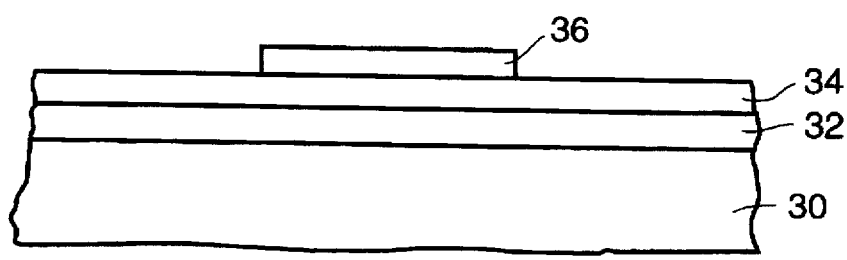
FIG. 2d is a partial cross-sectional view of the silicon substrate following removal of portions of the photoresist layer over field regions.

Portions of nitride layer 34 and pad oxide layer 32 over the field regions are then selectively removed. A photoresist layer is first deposited over the nitride layer. FIG. 2c is a partial cross-sectional view of silicon substrate 30 with a photoresist layer 36 formed over nitride layer 34. Photoresist layer 36 is preferably applied using common spin-coat techniques. Photoresist layer 36 is then exposed and developed using well-known photolithography methods, resulting in portions of photoresist layer 36 remaining only over device active areas. FIG. 2d is a partial cross-sectional view of silicon substrate 30 with portions of photoresist layer 36 removed over field regions.

Portions of nitride layer 34 not covered by photoresist are then selectively removed using a dry etch process (e.g., plasma etch). One such method involves placing silicon substrate 30 between two electrodes in a reaction chamber containing a substance comprising fluorine (e.g., $CF_4$, $SF_6$, $NF_3$, etc.), applying radio frequency energy between the electrodes, and reducing the pressure inside the reaction chamber.

Figure 2E:
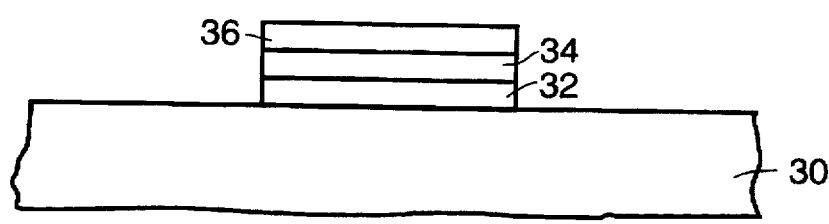
FIG. 2e is a partial cross-sectional view of the silicon substrate following selective removal of portions of the nitride and pad oxide layers over field regions.

Portions of pad oxide layer 32 not covered by nitride layer 34 are then selectively removed using a well-known wet or dry etch process. A suitable wet etch method involves immersing silicon substrate 30 in a solution of hydrofluoric acid (HF) mixed with water. A suitable dry etch method is described above. FIG. 2e is a partial cross-sectional view of silicon substrate 30 following selective removal of portions of nitride layer 34 and pad oxide layer 32 over field regions.

Figure 2F:
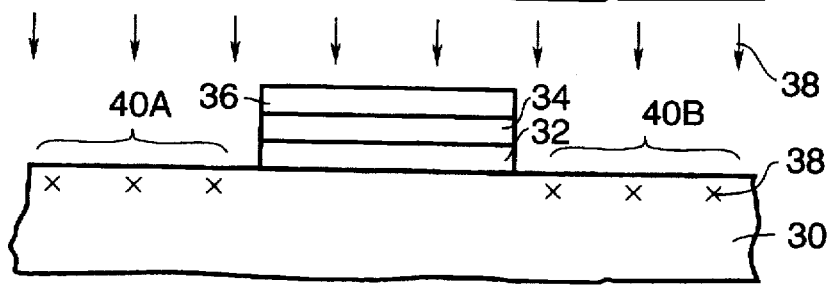
FIG. 2f is a partial cross-sectional view of incident dopant atoms forming channel stop implants in the field regions of the frontside surface of the silicon substrate.

After removal of portions of pad oxide layer 32, optional channel-stop implants may be formed in the field regions. As mentioned above, channel-stop implants serve to increase the doping levels in the field regions, increasing the turn-on threshold of any parasitic MOS transistors formed in the field regions. FIG. 2f is a partial cross-sectional view of incident dopant atoms 38 forming channel stop implants in the field regions of the frontside surface of silicon substrate 30. If silicon substrate 30 is doped with p-type dopant atoms, dopant atoms 38 may be boron atoms. If silicon substrate 30 is doped with n-type dopant atoms (or in n-type wells of a complementary MOS process), dopant atoms 38 may be arsenic atoms or phosphorus atoms.

Channel-stop implants are usually formed using an ion implantation procedure followed by electrical activation and anneal heating treatment. In a typical ion implantation procedure, silicon substrate 30 is placed within a chamber, the pressure within the chamber is reduced, and the frontside surface of silicon substrate 30 is subjected to a beam of accelerated ionized dopant atoms 38. Remaining portions of photoresist layer 36 help mask device active areas from dopant atoms during ion implantation. Accelerated dopant atoms 38 enter the frontside surface of silicon substrate 30 in the unmasked field regions and come to rest below the frontside surface, forming channel-stop implant portions 40a and 40b as shown in FIG. 2f. Following ion implantation, silicon substrate 30 is placed in a furnace, and the temperature within the furnace is increased to a desired level for a predetermined period of time. This heat treatment causes electrical activation of the dopant atoms within silicon substrate 30 and annealing of damage done to the crystalline structure of silicon substrate 30 during ion implantation. After any optional channel-stop implants have been formed, remaining portions of photoresist layer 36 may be removed using well-known techniques.

It is noted that channel-stop implants may also be formed in the field regions by ion implantation following the formation of a field oxide layer over the field regions as described below. An electrical activation and annealing heating treatment step always immediately follows ion implantation.

Figure 2G:
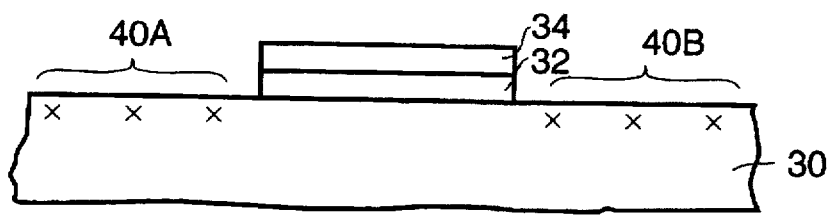
FIG. 2g is a partial cross-sectional view of the silicon substrate following removal of the remaining portions of the photoresist layer.

Following removal of remaining portions of photoresist layer 36, oxide masking structures remain over device active areas on the frontside surface of silicon substrate 30. The oxide masking structures consist of remaining portions of nitride layer 34, positioned over remaining portions of pad oxide layer 32 over device active areas. FIG. 2g is a partial cross-sectional view of silicon substrate 30 with remaining portions of photoresist layer 36 removed.

A relatively thick field oxide layer is then formed over the field regions. FIG. 2h is a partial cross-sectional view of silicon substrate 30 following thermal growth of a field oxide layer 42 over field regions. Field oxide layer 42 is preferably thermally grown according to a common wet oxidation process. One such method involves placing silicon substrate 30 into an oxidation furnace containing water vapor ($H_2O$), and increasing the temperature within the oxidation furnace to between 800° C. and 1200° C. An oxide ($SiO_2$) layer may thus be formed through the following reaction:

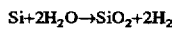

$$Si + 2H_2O \rightarrow SiO_2 + 2H_2$$

Field oxide layer 42 is preferably grown to a maximum thickness of about 4,000 angstroms. As field oxide layer 42 grows, remaining portions of pad oxide layer 32 merge with field oxide layer 42 at peripheries of remaining portions of nitride layer 34. As described above, a relatively thin pad oxide layer 32 is used in an effort to reduce the lateral encroachment of field oxide layer 42 into device active areas. As a result, field oxide layer 42 grows up around vertical edges of the remaining portions of nitride layer 34. This growth pattern of field oxide layer 42 around a remaining portion of nitride layer 34 is illustrated in FIG. 2h.

FIG. 2i is a partial cross-sectional view of silicon substrate 30 with remaining portions of nitride layer 34 removed according to the aforementioned dry etch process. FIG. 2j is a detailed view along plane A of FIG. 2i showing an undesirable elevational disparity in an upper surface of field oxide layer 42 near a perimeter where field oxide layer 42 merges with a remaining portion of pad oxide layer 32. Such elevational disparities are created when field oxide layer 42 grows up and around vertical edges of remaining portions of nitride layer 34. The magnitudes of the elevational disparities are proportional to the thicknesses of pad oxide layer 32 and nitride layer 34, and are also dependent upon oxidation conditions. Elevational disparities of up to one half of the thickness of the field oxide layer have been produced in experimental wafers.

Figure 3A:
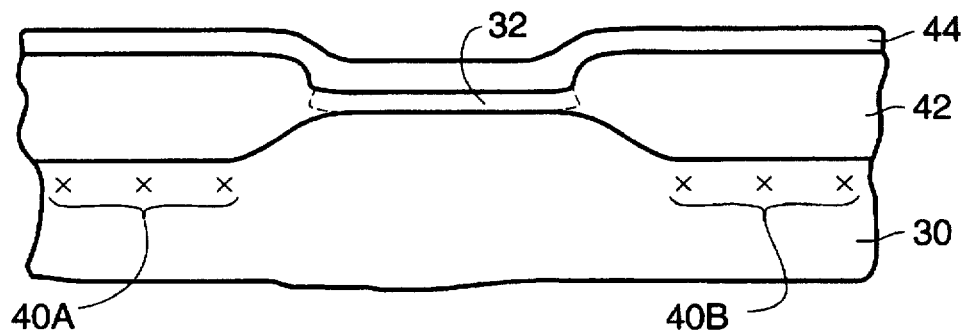
FIG. 3a is a partial cross-sectional view of the silicon substrate following deposition of an oxide layer over the field oxide layer and remaining portions of the pad oxide layer.
Figure 3B:
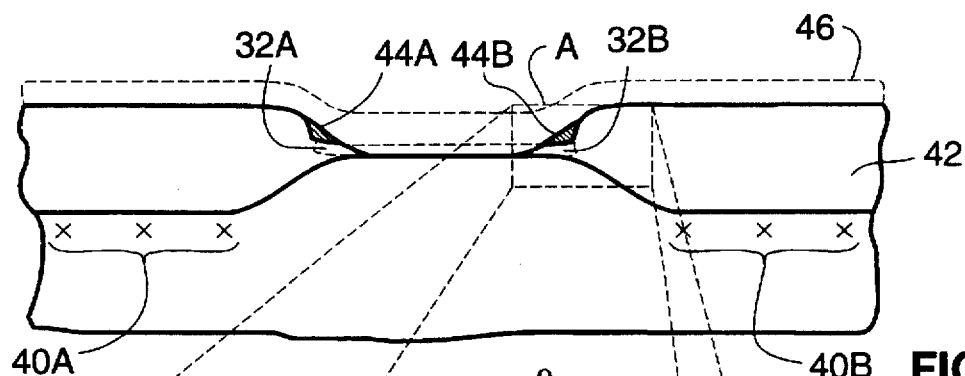
FIG. 3b is a partial cross-sectional view of the silicon substrate following application of a directional etch process.
Figure 3C:
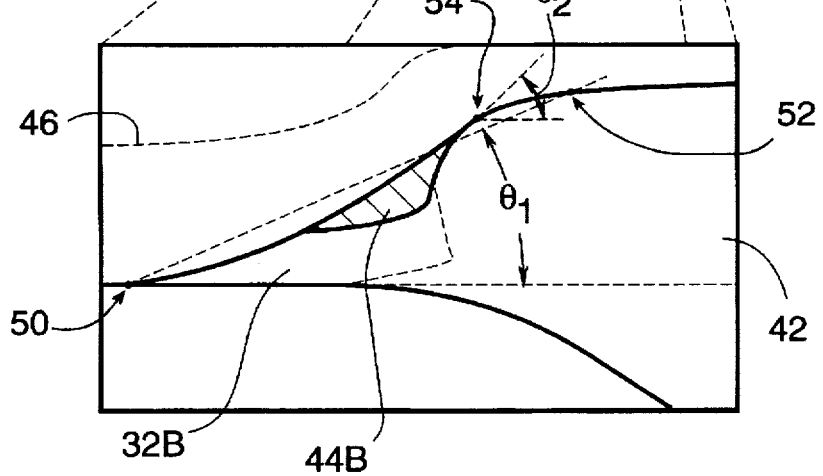
FIG. 3c is a detailed view along plane A of FIG. 3b showing how a remaining portion of the oxide layer fills an elevational disparity in the field oxide layer located near a perimeter of the field oxide layer.

A first embodiment of a method for enhancing the thickness of a field oxide layer at perimeters of field regions is illustrated in FIGS. 3a-3c. Following removal of the remaining portions of nitride layer 34, an oxide layer is deposited over remaining portions of pad oxide layer 32 and field oxide layer 42. FIG. 3a is a partial cross-sectional view of silicon substrate 30 following formation of an oxide layer 44 upon remaining portions of pad oxide layer 32 and field oxide layer 42.

Oxide layer 44 is preferably formed used a conformal deposition process. A conformal deposition process produces and oxide layer which is thicker in areas adjacent to vertical surfaces than on horizontal surfaces. Such a conformal oxide layer may be formed by placing silicon substrate 30 in a reaction chamber containing tetraethyl orthosilicate (TEOS) and increasing the temperature inside the reaction chamber is increased to about 725° C. Oxide layer 44 is preferably deposited to a thickness between 1,000 and 2,000 angstroms over horizontal surfaces. As a result of the conformal deposition process, oxide layer 44 is thicker in areas adjacent to the substantially vertical elevational disparities at perimeters of field oxide layer 42.

The upper surface of silicon substrate 30 is then subjected to an anisotropic (i.e., directional) dry etch process. A suitable directional dry etch process is a planar plasma etch process. In a typical planar etch process, silicon substrate 30 is placed between a pair of electrodes in a reaction chamber. A fluorine-containing gas is introduced into the reaction chamber at a flow rate necessary to achieve desired etch characteristics. Suitable fluorine-containing gases include $CF_4$, $CHF_3$, $C_2F_6$, and $C_3F_8$. The pressure within the reaction chamber is reduced to a desired pressure during the etch process, and the desired pressure is maintained throughout the etch process. A glow discharge (i.e., a plasma) is formed when radio frequency (RF) power is applied between the pair of electrodes. A bias voltage also applied between the pair of electrodes causes energetic ions to be accelerated toward the silicon substrate along lines normal to an exposed surface of the silicon substrate. As a result, horizontal components of structures located on the exposed surface of the silicon substrate are subjected to a greater Number of reactant species than are vertical components. Horizontal components are thus etched at a faster rate than vertical components. Etching is continued until all oxide is removed from over the device active areas.

FIG. 3b is a partial cross-sectional view of silicon substrate 30 following application of the directional etch process. Dashed line 46 indicates the original outline of an upper surface of oxide layer 44. Substantially all of oxide layer 44 is removed over horizontal surfaces. Only portions 44a and 44b of the original oxide layer 44, with significant vertical components, remain after the directional etch process. Remaining portions 44a and 44b of original oxide layer 44 are positioned over remaining portions 32a and 32b of original pad oxide layer 32, respectively. Remaining portions 44a and 44b serve to increase the thickness of field oxide layer 42 in critical areas at perimeters of the field regions.

FIG. 3c is a detailed view along plane A of FIG. 3b showing how remaining portion 44b of oxide layer 44 fills an elevational disparity in field oxide layer 42 located near a perimeter of the field oxide layer. Field oxide layer 42 is now considered to include the remaining portions 44a and 44b of oxide layer 44. A field oxide perimeter point 50 lies at the perimeter of field oxide layer 42. A field oxide maximum elevation point 52 lies where field oxide layer 42 reaches a maximum elevation above silicon substrate 30. An angle $\theta_1$ formed between the plane of the upper surface of silicon substrate 30 and a line connecting field oxide perimeter point 50 and field oxide maximum elevation point 52 as shown in FIG. 3c is always less than 60 degrees. In addition, at any arbitrary point 54 along the upper surface of field oxide layer 42 between field oxide perimeter point 50 and field oxide maximum elevation point 52, an angle $\theta_2$ formed between a line parallel to the upper surface of silicon substrate 30 and a line tangent to the surface of field oxide layer 42 as shown in FIG. 3c is also always less than 60 degrees.

Figure 4:
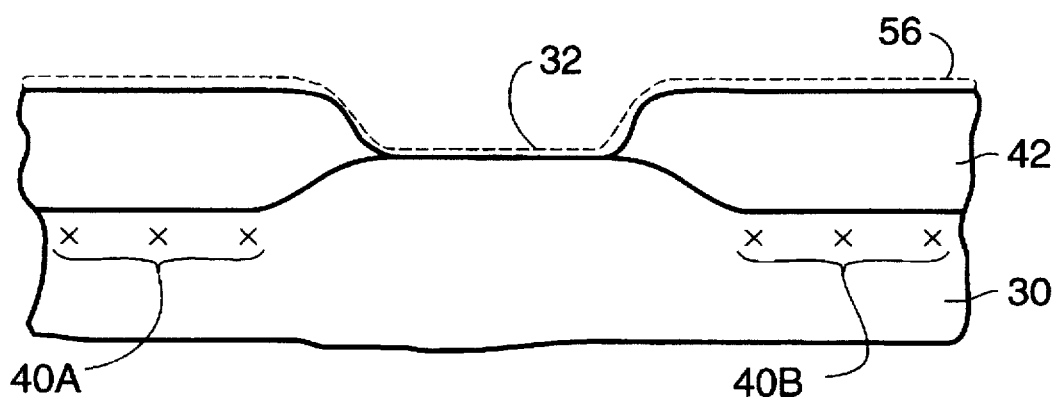
FIG. 4 is a partial cross-sectional view of the silicon substrate of FIG. 2i following etching removal of substantially all of the remaining portions of the pad oxide layer and a portion of the upper surface of the field oxide layer.

Other embodiments of a method for enhancing the thickness of a field oxide layer at perimeters of field regions involve first removing substantially all of the remaining portions of pad oxide layer 32 along with enough of the upper surface of field oxide layer 42 in order to remove all oxide from over the device active areas. FIG. 4 is a partial cross-sectional view of the silicon substrate of FIG. 2i following etching removal of all oxide from over the device active areas. A well-known wet or dry etch process may be used during the removal process. Remaining portions of pad oxide layer 32 are substantially removed during the etching process, along with a portion of the upper surface of field oxide layer 42. Dashed line 56 shows the original outline of upper surfaces of field oxide layer 42 and pad oxide layer 32.

Figure 5A:
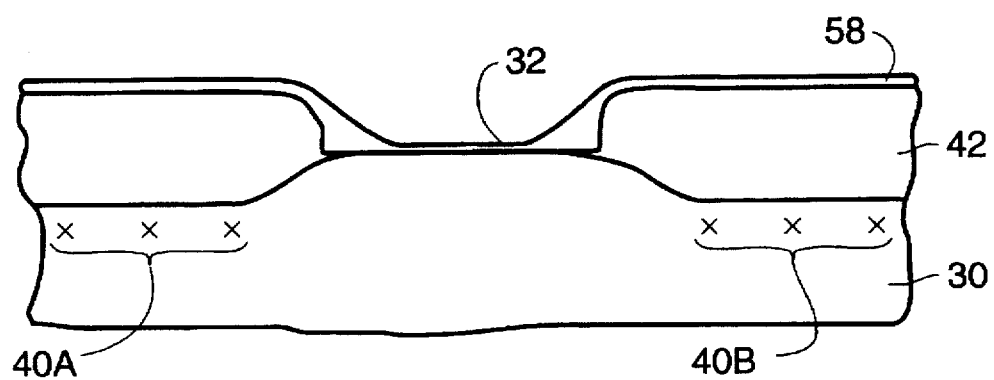
FIG. 5a is a partial cross-sectional view of the silicon substrate following formation of an oxide layer upon the field oxide layer and exposed portions of the silicon substrate in device active areas.
Figure 5B:
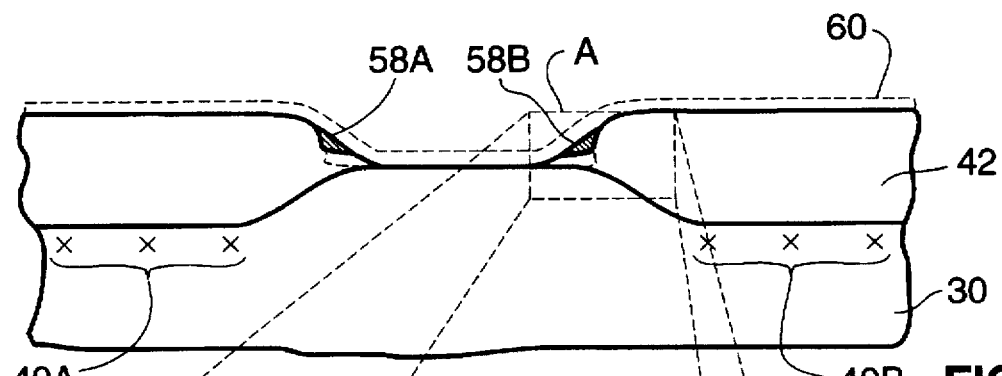
FIG. 5b is a partial cross-sectional view of the silicon substrate following application of a directional etch process.
Figure 5C:
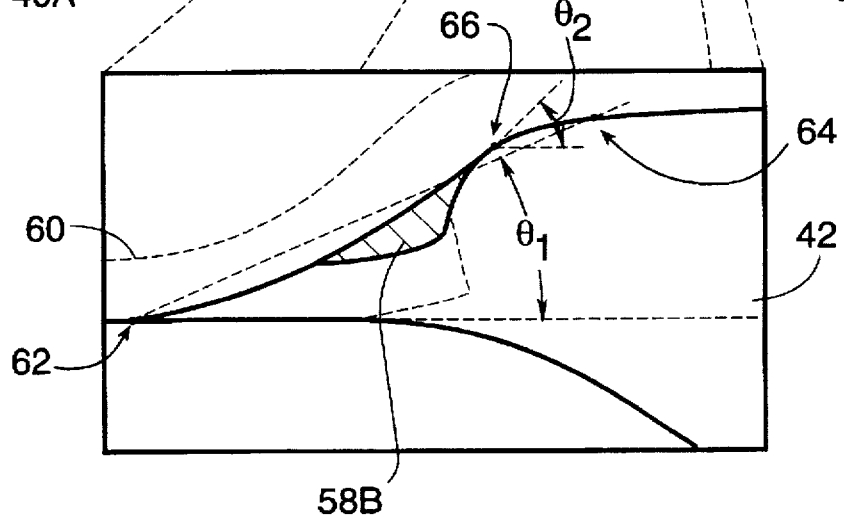
FIG. 5c is a detailed view along plane A of FIG. 5b showing how a remaining portion of the oxide layer fills an elevational disparity in the field oxide layer located near a perimeter of the field oxide layer.

Steps of a second embodiment of a method for enhancing the thickness of a field oxide layer at perimeters of field regions are illustrated in FIGS. 5a–5c. After remaining portions of pad oxide layer 32 and a portion of the upper surface of field oxide layer 42 are removed (FIG. 4), an oxide layer is deposited over the field oxide layer. FIG. 5a is a partial cross-sectional view of silicon substrate 30 following formation of an oxide layer 58 upon field oxide layer 42. Oxide layer 58 is preferably deposited using the conformal CVD process described above and to a thickness between 1,000 and 2,000 angstroms over horizontal surfaces.

The upper surface of silicon substrate 30 is then subjected to a directional dry etch process as described above. Etching is continued until all oxide is removed from over the device active areas. FIG. 5b is a partial cross-sectional view of silicon substrate 30 following application of the directional etch process. Dashed line 60 indicates the original outline of oxide layer 58. Only portions 58a and 58b of the original oxide layer 58 remain after etching, due to the directional nature of the etch process. Remaining portions 58a and 58b serve to increase the thickness of field oxide layer 42 in critical areas of elevational disparity at perimeters of the field oxide layer.

FIG. 5c is a detailed view along plane A of FIG. 5b showing how remaining portion 58b of oxide layer 58 fills an elevational disparity in field oxide layer 42 located near a perimeter of the field oxide layer. In this case the elevational disparity is larger due to field oxide layer etch prior to oxide layer deposition. Field oxide layer 42 is now considered to include the remaining portions of oxide layer 58. A field oxide perimeter point 62 lies at the perimeter of field oxide layer 42. A field oxide maximum elevation point 64 lies where field oxide layer 42 reaches a maximum elevation above silicon substrate 30. An angle $\theta_1$ formed between the plane of the upper surface of silicon substrate 30 and a line connecting field oxide perimeter point 62 and field oxide maximum elevation point 64 as shown in FIG. 5c is always less than 60 degrees. In addition, at any arbitrary point 66 along the upper surface of field oxide layer 42 between field oxide perimeter point 62 and field oxide maximum elevation point 64, an angle $\theta_2$ formed between a line parallel to the upper surface of silicon substrate 30 and a line tangent to the surface of field oxide layer 42 as shown in FIG. 5c is also always less than 60 degrees.

Figure 6A:
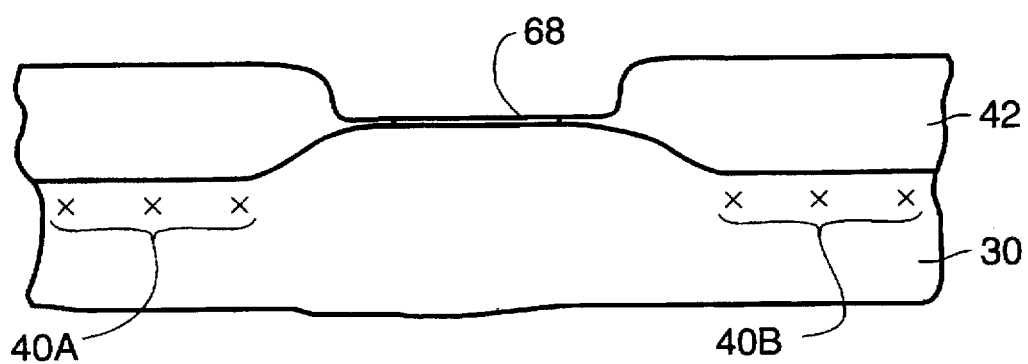
FIG. 6a is a partial cross-sectional view of the silicon substrate of FIG. 2i following formation of a sacrificial oxide layer in and on device active areas on the surface of the silicon substrate.

FIGS. 6a–6d illustrate steps of a third embodiment of a method for enhancing the thickness of a field oxide layer at perimeters of field regions. After remaining portions of pad oxide layer 32 and a portion of the upper surface of the field oxide layer 42 are removed (FIG. 4), a sacrificial oxide layer is formed on and in areas of exposed silicon on the surface of silicon substrate 30. FIG. 6a is a partial cross-sectional view of silicon substrate 30 following formation of a sacrificial oxide layer 68 in and on device active areas on the frontside surface of silicon substrate 30. Sacrificial oxide layer 68 is formed to remove any traces of nitride remaining after the removal of nitride layer 34 as nitride traces impede the subsequent growth of a gate oxide layer over device active areas. Sacrificial oxide layer 68 is preferably thermally grown according to a common wet oxidation process. Sacrificial oxide layer 68 will thus not grow appreciably over field oxide layer 42. One such method involves placing silicon substrate 30 into an oxidation furnace containing water vapor ($H_2O$), and increasing the temperature within the oxidation furnace to between 800° C. and 1200° C. A oxide ($SiO_2$) layer may thus be formed through the following reaction:

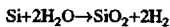

$$Si+2H_2O \rightarrow SiO_2+2H_2$$

Sacrificial oxide layer 68 is preferably grown to a thickness of between 200 angstroms and 600 angstroms.

Figure 6B:
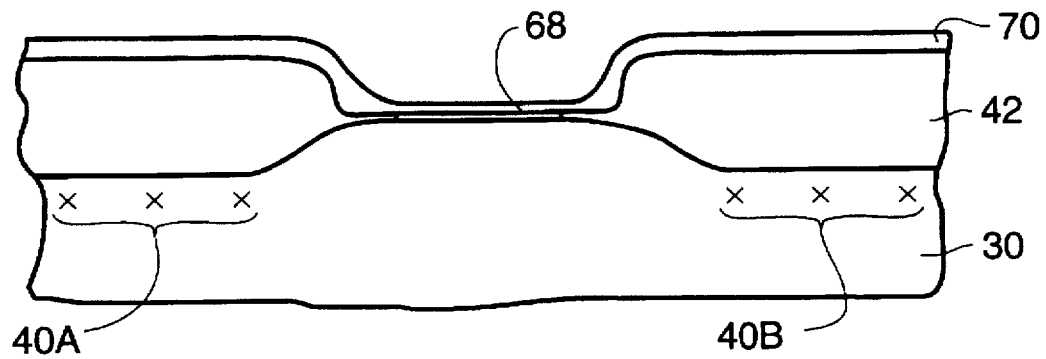
FIG. 6b is a partial cross-sectional view of the silicon substrate following deposition of an oxide layer over the field and sacrificial oxide layers.

Following the growth of the sacrificial oxide layer, an oxide layer is deposited upon the field and sacrificial oxide layers. FIG. 6b is a partial cross-sectional view of silicon substrate 30 following deposition of an oxide layer 70 over field oxide layer 42 and sacrificial oxide layer 68. Oxide layer 70 is preferably formed using the conformal CVD deposition process described above and to a thickness between 1,000 and 2,000 angstroms.

Figure 6C:
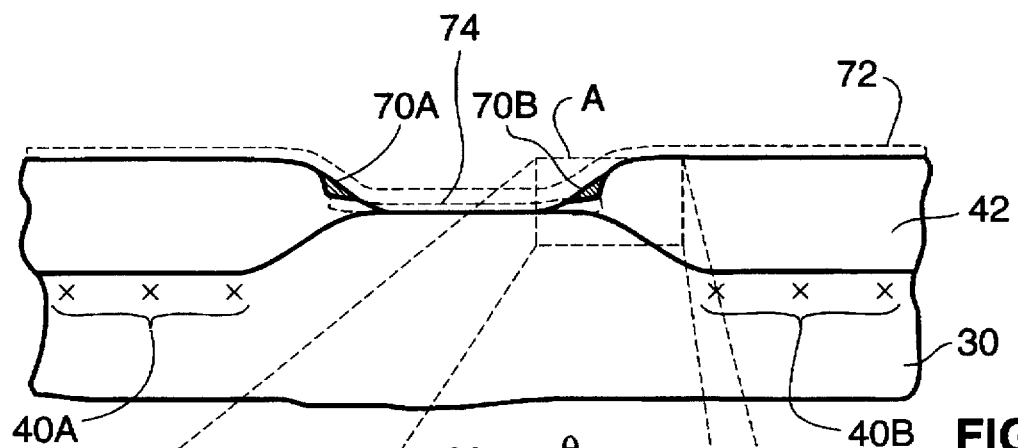
FIG. 6c is a partial cross-sectional view of the silicon substrate following application of a directional etch process.

The upper surface of silicon substrate 30 is then subjected to a directional dry etch process as described above. Etching is continued until all oxide is removed from over the device active areas. FIG. 6c is a partial cross-sectional view of silicon substrate 30 following application of the directional etch process. Dashed line 72 indicates the original outline of oxide layer 70, and dashed line 74 indicates the original outline of sacrificial oxide layer 68. Only portions 70a and 70b of the original oxide layer 70 remain after etching, due to the directional nature of the etch process. Remaining portions 70a and 70b serve to increase the thickness of field oxide layer 42 in critical areas at perimeters of the field regions.

Figure 6D:
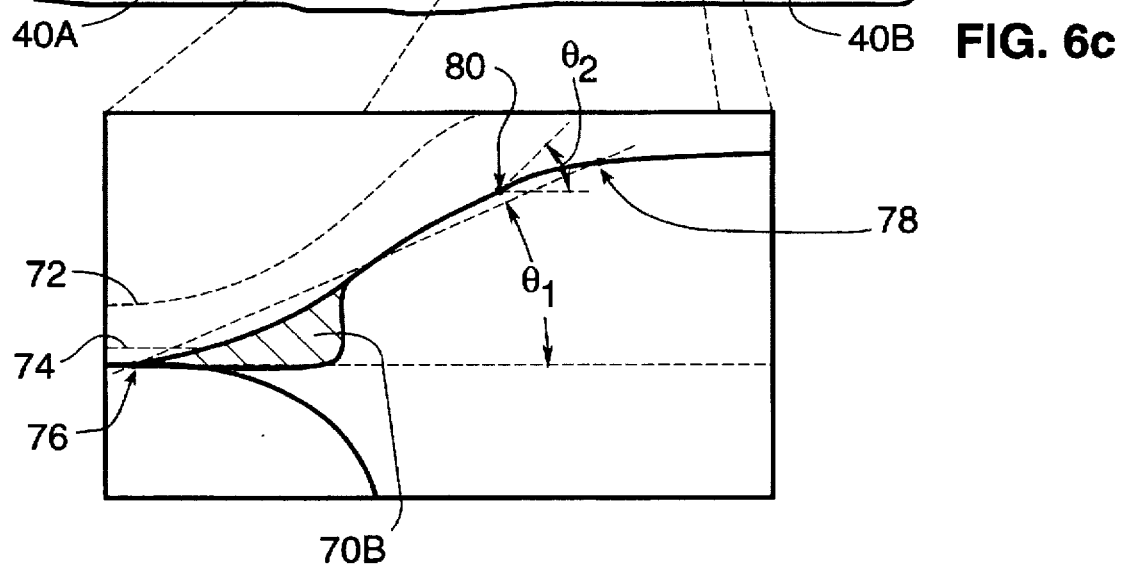
FIG. 6d is a detailed view along plane A of FIG. 6c showing how a remaining portion of the oxide layer fills an elevational disparity in the field oxide layer located near a perimeter of the field oxide layer.

FIG. 6d is a detailed view along plane A of FIG. 6c showing how remaining portion 70b of oxide layer 70 fills an elevational disparity in field oxide layer 42 located near a perimeter of field oxide layer 42. The elevational disparity is relatively larger due to etching of the field oxide layer and sacrificial oxide layer prior to oxide layer deposition. Sacrificial oxide layer 68 is removed during the etching process, and field oxide layer 42 is now considered to include the remaining portions of oxide layer 70. A field oxide perimeter point 76 lies at the perimeter of field oxide layer 42. A field oxide maximum elevation point 78 lies where field oxide layer 42 reaches a maximum elevation above silicon substrate 30. An angle $\theta_1$ formed between the plane of the upper surface of silicon substrate 30 and a line connecting field oxide perimeter point 76 and field oxide maximum elevation point 78 as shown in FIG. 6d is always less than 60 degrees. In addition, at any arbitrary point 80 along the upper surface of field oxide layer 42 between field oxide perimeter point 76 and field oxide maximum elevation point 78, an angle $\theta_2$ formed between a line parallel to the upper surface of silicon substrate 30 and a line tangent to the surface of field oxide layer 42 as shown in FIG. 6d is also always less than 60 degrees.

Figure 7A:
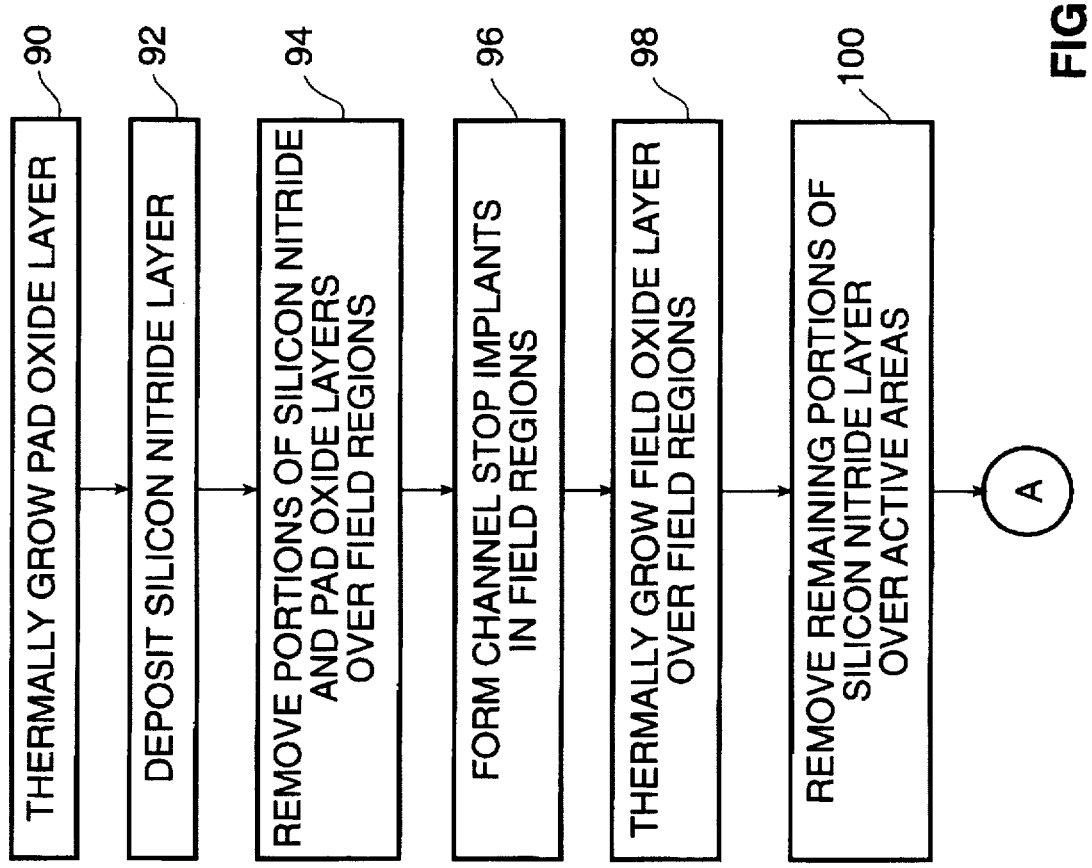
FIG. 7a is a flow chart of the present method including several preferred embodiments.

FIG. 7a is a flow chart of the present method including several embodiments. During a first step 90, a pad oxide layer is thermally grown over the frontside surface of a silicon wafer. A silicon nitride layer is then deposited over the pad oxide layer during a second step 92. The pad oxide and silicon nitride layers are then selectively patterned to remove portions over the field regions during a step 94. During a step 96, channel stop implants are formed in field regions. A field oxide layer is then thermally grown over the field regions during a step 98. The remaining portions of the silicon nitride layer over the device active areas are then removed during a step 100.

Figure 7B:
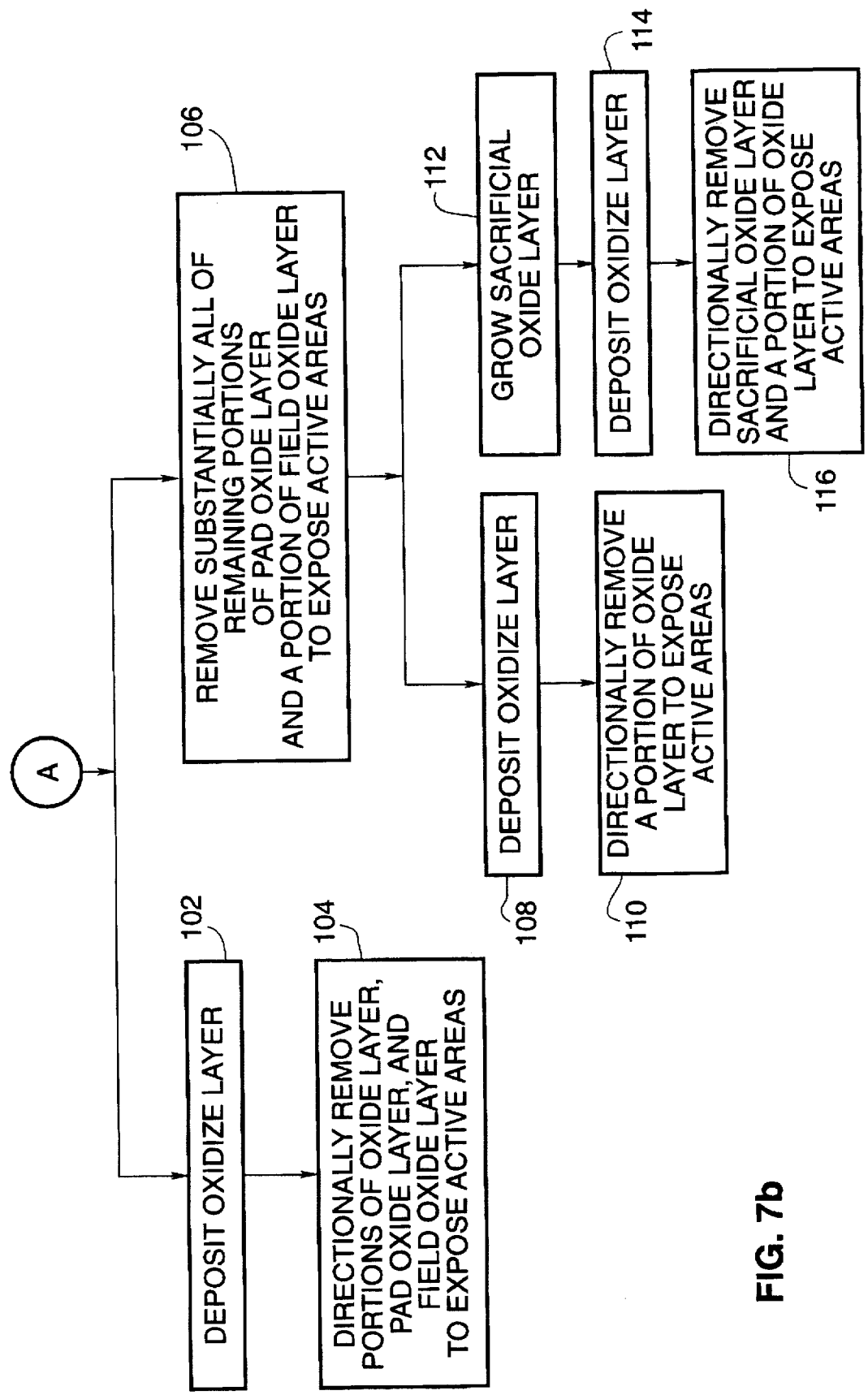

FIG. 7b is a continuation of the flow chart of FIG. 7a. Continuing from step 100 of FIG. 7a, an oxide layer may be deposited over the field oxide layer and remaining portions of the pad oxide layer during a step 102. This oxide layer is preferably formed using the conformal CVD deposition process described above. During a step 104, a directional etch process is used to remove portions of the oxide layer, pad oxide layer, and field oxide layer in order to expose the silicon substrate in device active areas. Following step 104, remaining portions of the oxide layer fill in elevational disparities in field oxide layer located near perimeters of the field oxide layer. The thickness of the field oxide layer is thus enhanced at perimeters.

Following step 100 of FIG. 7a, a step 106 may alternately be performed. Step 106 includes the removal of substantially all of the remaining portions of the pad oxide layer and a portion of the upper surface of the field oxide layer in order to expose the silicon substrate in device active areas. Following step 106, a step 108 may be performed. An oxide layer is deposited over the device active areas and the field oxide layer during step 108. This oxide layer is preferably formed using the conformal CVD deposition process described above. During a step 110, a directional etch process is used to remove most of the oxide layer in order to expose the silicon substrate in device active areas. Following step 110, remaining portions of the oxide layer fill in elevational disparities in field oxide layer located near perimeters of the field oxide layer. The thickness of the field oxide layer is again enhanced at perimeters.

Following step 106, a step 112 may alternately be performed. Step 112 includes growing a sacrificial oxide layer in and on regions of exposed silicon in device active areas. An oxide layer is then deposited over the field and sacrificial oxide layers during a step 114. This oxide layer is preferably formed using the conformal CVD deposition process described above. During a step 116, a directional etch process is used to remove the sacrificial oxide layer and most of the oxide layer in order to expose the silicon substrate in device active areas. Following step 116, remaining portions of the oxide layer fill in elevational disparities in field oxide layer located near perimeters of the field oxide layer. The thickness of the field oxide layer is thus again enhanced at perimeters.

It will be appreciated to those skilled in the art having the benefit of this disclosure that this invention is believed to be capable of enhancing the thickness of a field oxide layer at perimeters of field regions. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method of forming oxide in a substrate field region, comprising:

forming an opening through an oxide barrier layer comprising a silicon nitride layer overlying a pad oxide layer, wherein the opening is used to expose an upper surface of the substrate field region;

growing an oxide substantially within said opening;

depositing an oxide adjacent to the entire upper surface of the grown said oxide; and directionally removing the deposited said oxide by directing etchant ions in a direction normal to said upper surface, whereby the deposited said oxide is removed except for a portion retained on a grown oxide surface which extends substantially normal to said upper surface adjacent the lateral perimeter of said grown oxide.

2. The method as recited in claim 1, wherein said forming step comprises:

growing said layer of pad oxide across a semiconductor substrate;

depositing said layer of silicon nitride across said pad oxide to a thickness more than two times the pad oxide thickness; and selectively removing said silicon-nitride and pad oxide from said substrate field region.

3. The method as recited in claim 2, wherein said pad oxide thickness is less than 400 angstroms.

4. The method as recited in claim 1, wherein said growing step comprises subjecting said substrate field region to a heat cycle while in the presence of an oxygen ambient.

5. The method as recited in claim 1, wherein said depositing step comprises a conformal CVD deposition process.

6. The method as recited in claim 5, wherein the conformal CVD deposition process involves inserting the substrate field region into a reaction chamber containing tetraethyl orthosilicate (TEOS) and increasing the temperature inside the reaction chamber to about 725° C.

7. The method as recited in claim 1, wherein said directionally removing step comprises inserting the substrate field region, upon which the grown and deposited oxide are formed, into a fluorine-containing gas and between a pair of charged electrodes.

8. The method as recited in claim 1, wherein said directionally removing step comprises inserting the substrate field region upon which the grown and deposited oxides are formed into an ion-assisted etch device.

9. The method as recited in claim 1, further comprising removing said oxide barrier layer prior to said depositing step.

10. The method as recited in claim 1, further comprising removing the oxide barrier layer to expose an upper surface of one or more substrate device active areas after said oxide is grown and before said deposited oxide is directionally removed.

11. The method as recited in claim 10, further comprising growing a sacrificial oxide layer upon and within the exposed upper surface of the substrate device active areas after said oxide barrier layer is removed and before said oxide is directionally removed.

12. The method as recited in claim 11, further comprising removing the sacrificial oxide layer during the time in which said deposited said oxide is directionally removed.

* * * * *

UNITED STATES PATENT AND TRADEMARK OFFICE

CERTIFICATE OF CORRECTION

PATENT NO. : 5,686,346

DATED : November 11, 1997

INVENTOR(S) : Michael P. Duane

It is certified that error appears in the above-identified patent and that said Letters Patent is hereby corrected as shown below:

<u>In the Claims</u>:

Claim 2, col. 12, line 21, please replace "silicon-nitride" with "silicon nitride".

Signed and Sealed this

Twenty-fourth Day of February, 1998

*Attest:*

BRUCE LEHMAN

*Attesting Officer*   *Commissioner of Patents and Trademarks*